US008529987B2

(12) United States Patent
Vance et al.

(10) Patent No.: US 8,529,987 B2
(45) Date of Patent: Sep. 10, 2013

(54) IN-PROCESS ORIENTATION OF PARTICLES IN A DIRECT-WRITE INK TO CONTROL ELECTRICAL CHARACTERISTICS OF AN ELECTRICAL COMPONENT BEING FABRICATED

(75) Inventors: Jonathan B. Vance, St. Charles, MO (US); Scott R. Johnston, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 875 days.

(21) Appl. No.: 12/534,886

(22) Filed: Aug. 4, 2009

(65) Prior Publication Data

US 2011/0033632 A1 Feb. 10, 2011

(51) Int. Cl.
*B05B 5/00* (2006.01)
*B05B 5/043* (2006.01)
*B05B 5/025* (2006.01)

(52) U.S. Cl.
USPC ............. 427/123; 427/58; 427/180; 427/197; 427/201; 427/455; 118/308; 118/309; 118/300; 239/3; 239/690

(58) Field of Classification Search
None
See application file for complete search history.

(56) References Cited

U.S. PATENT DOCUMENTS 4,111,294 A * 9/1978 Carpenter et al. ............ 198/381
2005/0041229 A1 2/2005 Meisburger
2006/0266235 A1* 11/2006 Sandhu et al. ................ 101/174
2006/0276099 A1* 12/2006 Vink et al. ...................... 445/35
2008/0167202 A1 7/2008 Mirkin et al.

OTHER PUBLICATIONS

Morrison, Defense Against Bioterror: Detection Technologies, Implementation Strategies and Commercial Opportunities, Springer, (2005), pp. 129-131.*

* cited by examiner

*Primary Examiner* — Nathan Empie
*Assistant Examiner* — Lisha Jiang
(74) *Attorney, Agent, or Firm* — Charles L. Moore; Moore & Van Allen PLLC

(57) ABSTRACT

A system for in-process orientation of particles used in direct-write inks for fabricating a component may include a device for polarizing direct-write particles in an aerosol. An outlet may direct the aerosol including the polarized direct-write particles on a substrate to form a component. An apparatus may cause the polarized direct-write particles to be aligned in a selected orientation to form the component with predetermined characteristics when deposited on the substrate.

14 Claims, 2 Drawing Sheets

200

202 — PRODUCE AEROSOL CONTAINING DIRECT-WRITE PARTICLES (NANO-PARTICLES, ETC.)

Figure 1:
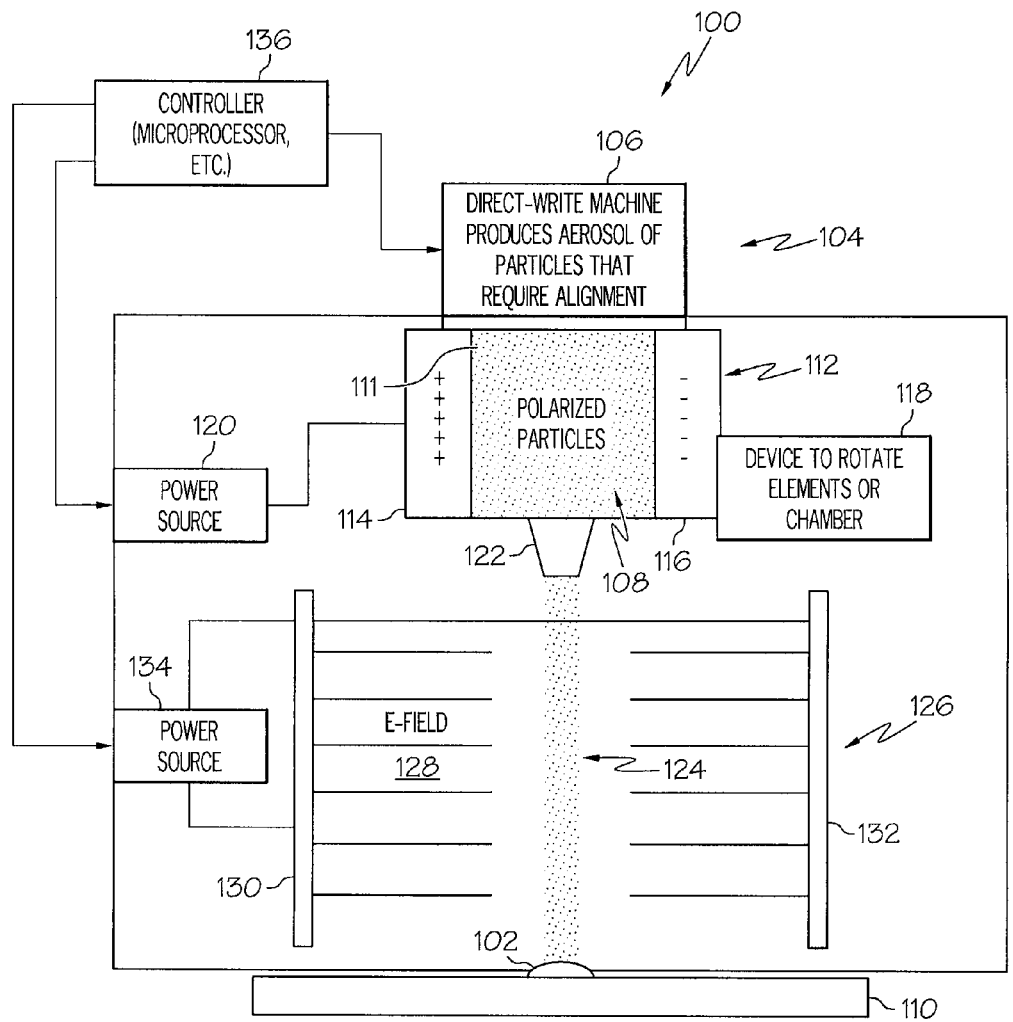

204 — DIRECT AEROSOL INTO HOLDING CHAMBER ADJACENT NOZZLE-EXIT; SUSPEND DIRECT-WRITE PARTICLES IN AEROSOL IN HOLDING CHAMBER

206 — GENERATE ELECTRIC FIELD IN HOLDING CHAMBER TO CAUSE ELECTOSTATIC INDUCTION OF AEROSOL TO POLARIZE THE SUSPENDED DIRECT-WRITE PARTICLES

208 — DIRECT AEROSOL CONTAINING POLARIZED DIRECT-WRITE PARTICLES THROUGH EXIT NOZZLE AND FOCUSED ON DIRECT-WRITE SURFACE (SUBSTRATE, ETC.) IN A DEPOSITION COLUMN

210 — PASS DEPOSITION COLUMN THROUGH ELECTRIC FIELD EXTERNAL TO THE DIRECT-WRITE DEVICE AND GENERATED ADJACENT TO AND SUBSTANTIALLY ORTHOGONAL TO THE DEPOSITION COLUMN TO CAUSE POLARIZED DIRECT-WRITE PARTICLES IN AEROSOL TO BE ALIGNED BY THE ELECTRIC FIELD

212 — FORMING AN ELECTRICAL COMPONENT (CONDUCTIVE TRACE, RESISTOR ELEMENT, ETC.) ON THE DIRECT-WRITE SURFACE; CONTROLLING E-FIELD IN HOLDING CHAMBER, E-FIELD EXTERNAL TO DIRECT-WRITE DEVICE, FLOW OF DEPOSITION COLUMN, CONCENTRATION/VOLUME OF DIRECT-WRITE PARTICLES, ETC. TO FORM ELECTRICAL COMPONENT HAVING PREDETERMINED CHARACTERISTICS

FIG. 2

IN-PROCESS ORIENTATION OF PARTICLES IN A DIRECT-WRITE INK TO CONTROL ELECTRICAL CHARACTERISTICS OF AN ELECTRICAL COMPONENT BEING FABRICATED

This invention was made with Government support under FA8650-08-C-5511 awarded by the United States Air Force. The Government has certain rights in this invention.

FIELD

The present disclosure relates to the fabrication of electrical components and circuits, and more particularly to a system and method for in-process orientation of particles in a direct-write ink to control electrical characteristics of an electrical component formed by direct-writing.

BACKGROUND

Electrical components, for example wire traces and circuit components such as resistors, capacitors, and transistors may be created using direct-write technology. Direct-write technology involves printing micro and nano-sized circuits or circuit components without using lithographic techniques. In direct-write technology a direct-write ink including a conductive or semiconductor material may be deposited or direct-written on a substrate to form an electrical component. Direct-write devices suffer from repeatability issues due to how the inks set up once they are deposited. The materials for forming the electrical components are not controlled in any way once they leave the nozzle of a direct-write device for deposition on the substrate. The ink is atomized as much as possible for fine deposition resulting in particles or clusters of particles that are randomly oriented when deposited and therefore the particles are not optimally oriented. The aerosol mist is focused onto the substrate and no further movement or control of the ink can be enacted.

SUMMARY

In accordance with an embodiment, a system for in-process orientation of particles used in direct-write inks for fabricating a component may include a device for polarizing direct-write particles in an aerosol. An outlet may direct the aerosol including the polarized direct-write particles on a substrate to form a component. An apparatus may cause the polarized direct-write particles to be aligned in a selected orientation to form the component with predetermined characteristics when deposited on the substrate.

In accordance with an embodiment, a system for in-process orientation of particles used in direct-write inks for fabricating an electrical component may include a holding chamber for retaining an aerosol, wherein the aerosol includes direct-write particles. The system may also include a structure to generate an electric field in the holding chamber to cause electrostatic induction of the aerosol to polarize the direct-write particles in the aerosol. An exit nozzle may direct the aerosol including the polarized direct-write particles on a substrate to form an electrical component. The system may also include another structure to generate another electric field. The aerosol including the polarized direct-write particles may be directed through the other electric field toward the substrate. The other electric field causes the polarized direct-write particles to be aligned in a selected orientation to form the electrical component with predetermined electrical characteristics when deposited on the substrate.

In accordance with another embodiment, a method for in-process orientation of particles used in direct-write inks for fabricating an electrical component may include polarizing direct-write particles in an aerosol and directing the aerosol including the polarized direct-write particles in a deposition column or stream on a substrate to form an electrical component. The method may also include aligning the polarized direct-write particles in the deposition column in a selected orientation to form the electrical component with predetermined electrical characteristics.

In accordance with another embodiment, a method to make an electrical component may include providing a substrate. The method may also include producing an aerosol comprising a plurality of direct-write particles. The method may additionally include placing the aerosol comprising the plurality of direct-write particles in a first electric field to cause electrostatic induction of the aerosol to polarize the direct-write particles in the aerosol. The method may also include directing the aerosol comprising the polarized direct-write particles in a deposition column on a substrate to form an electrical component. The method may further include directing the deposition column through a second electric field to align the polarized direct-write particles in a selected orientation to form the electrical component with a predetermined electrical characteristic.

Other aspects and features of the present disclosure, as defined solely by the claims, will become apparent to those ordinarily skilled in the art upon review of the following non-limited detailed description of the disclosure in conjunction with the accompanying figures.

BRIEF DESCRIPTION OF THE SEVERAL VIEWS OF THE DRAWINGS

The following detailed description of embodiments refers to the accompanying drawings, which illustrate specific embodiments of the disclosure. Other embodiments having different structures and operations do not depart from the scope of the present disclosure.

FIG. 1 is a block diagram of an example of a system for in-process orientation of particles in a direct-write ink to control electrical characteristics in accordance with an embodiment of the present disclosure.

FIG. 2 is a flow chart of a method for in-process orientation of particles in a direct-write ink to control electrical characteristics in accordance with an embodiment of the present disclosure.

DESCRIPTION

The following detailed description of embodiments refers to the accompanying drawings, which illustrate specific embodiments of the disclosure. Other embodiments having different structures and operations do not depart from the scope of the present disclosure.

FIG. 1 is a block diagram of an example of a system 100 for in-process orientation of particles in a direct-write ink to control characteristics of an electrical component 102 or other type component being formed by a direct-write machine 104 or process in accordance with an embodiment of the present disclosure. An example of a direct-write machine 104 is an Aerosol Jet deposition system as provided by Optomec, Inc. of Albuquerque, N. Mex. Aerosol Jet and Optomec are trademarks of Optomec, Inc. in the United States, other countries or both. The direct-write machine 104 may produce an aerosol 106 containing direct-write particles 108. The direct-write particles 108 may be introduced into an inert gas propellant or other carrying medium capable of transporting the particles 108 to form the aerosol 106 for being sprayed or deposited on a substrate 110 to form the electrical component 102. The electrical component 102 may be a conductive or semiconductor line trace, resistor element, capacitor, inductor, semiconductor chip, or other electrical device, electrical circuit, or other electrical component. The direct-write particles 108 may include a nanomaterial, such as nanoparticles, carbon nanotubes, or similar materials or particles.

The aerosol 106 containing the direct-write particles 108 or nanoparticles or ink may be directed or channeled into a holding chamber 111 or reservoir. A structure 112 may be provided to generate an electric field (e-field) or electromagnetic field in the holding chamber 111 to cause electrostatic induction of the aerosol 106 to polarize the direct-write particles 108. For example, if the direct-write particles 108 are carbon nanotubes, the carbon nanotubes may have a somewhat elongated structure. Opposite ends of each nanotube may be charged to a different electrical potential. For instance, one end of the nanotube may be substantially positively electrically charged and an opposite end of the nanotube may be substantially negatively electrically charged by the electrostatic induced e-field in the holding chamber 111.

An exemplary structure 112 to generate the electric field in the holding chamber 111 may include a positive electrically chargeable element 114 and a negative electrically chargeable element 116 disposed on opposite sides of the holding chamber 111. A device 118 may be provided to move the positive electrically chargeable element 114 and the negative electrically chargeable element about the holding chamber 111 to cause electrostatic induction of the aerosol 106 containing the direct-write particles 108 within the holding chamber 111 to polarize the direct-write particles 108. In another embodiment, the device 118 may be adapted to move or rotate the holding chamber 111 in order to induce the electrostatic charge and to polarize the particles 108.

In one embodiment, the holding chamber 111 may include a substantially cylindrical container formed of an electrically conductive material or semiconductor material. Each of the electrically chargeable elements 114 and 116 may be an electrically conductive plate or brush adapted to slidably contact the cylindrical container to induce the electrostatic field in the container or holding chamber 111. The device 118 to move either the holding chamber 111 or the electrically chargeable elements 114 and 116 relative to one another may be an electric motor. The electric motor may rotate either the holding chamber 111 or the positive and negative electrically chargeable elements 114 and 116 relative to one another to cause electrostatic induction of the aerosol 106 in the chamber 111 and polarization of the direct-write particles 108.

A power source 120 or supply and associated circuitry may be provided to charge the positive and negative electrically chargeable elements 114 and 116. The level or amount of the positive and negative charge on the respective elements 114 and 116 will be a function of the characteristics of the direct-write particles 108 being used and the aerosol 106.

The system 100 or direct-write machine 104 may include an exit nozzle 122, end-effector, or similar outlet that may be adjacent to the holding chamber 111. The direct-write particles 108 will be charged up until the moment before the aerosol 106 or ink containing the particles 108 is discharged from the exit nozzle 122. The direct-write particles 108 may be held in the holding chamber 111 for a preset time period to adequately charge or polarize the particles 108. The exit nozzle 122 may direct or focus the aerosol 106 including the polarized direct-write particles 108 on the substrate 110 to form the electrical component 102. The exit nozzle 122 may be adapted to form the aerosol 106 and polarized direct-write particles 108 in a deposition column 124 or stream for directing the direct-write particles 108 in a predetermined pattern on the substrate 110 to form the electrical component 102.

The system 100 may include another structure 126 to generate another electric field 128 or electromagnetic field external to the direct-write machine 104. The aerosol 106 including the polarized direct-write particles 108 may be directed or caused to pass through the other electric field 128 or external electric field toward the substrate 110. The external electric field 128 may be substantially orthogonal to the deposition column 124. The external electric field 128 causes the polarized direct-write particles 108 to be aligned in a selected orientation based on the characteristics of the external electric field 128 to form the electrical component 102 with predetermined electrical characteristics when deposited on the substrate 110. For example, in the case where the direct-write particles 108 may be polarized carbon nanotubes as described above, the nanotubes may be deposited or printed in a selected orientation to form a resistor or other component. The nanotubes may be deposited or printed in a predetermined pattern or layers with the selected orientation or alignment to provide specific resistor values. Previously, this was not possible. The aerosol mist containing particles or ink was merely focused onto the substrate 110 and no further movement or control of the aerosol or ink was performed or enacted and each of the particles were deposited with random orientation or alignment.

The controlled orientation of the direct-write particles 108 in the aerosol 106 permits wire traces to be built by stacking multiple, repeated lines of ink or direct-write material or particles 108 onto one another. Because of the alignment of the particles 108, the bonding strength and resilience between the successive layers of material or particles 108 may be significantly improved with the in-process control of the orientation or alignment of the particles 108 as provided by the present disclosure compared to just depositing the particles 108 without any alignment.

An exemplary structure that may be used for the structure 126 to generate the external electric field 128 to cause the polarized direct-write particles 108 to be aligned in a predetermined orientation may include a positive electrically chargeable plate 130 and a negative electrical chargeable plate 132. The negative electrically chargeable plate 132 may be disposable on an opposite side of the deposition column 124 relative to the positive electrically chargeable plate 130 to cause the predetermined alignment of the polarized direct-write particles 108 in the aerosol 106. The positive electrically chargeable plate 130 and the negative electrically chargeable plate 132 may be spaced at a selected distance from one another and from the deposition column 124 based on a composition or characteristics of the direct-write particles 108 and other parameters related to the aerosol 106 and particles 108 suspended therein. The electrically chargeable plates 130 and 132 may also be a selected distance from the exit nozzle 122 depending upon parameters and characteristics associated with the aerosol 106 and the direct-write particles 108 suspended therein, such as type of particles, type of aerosol, flow rate, flow volume, concentration and similar parameters. The plates 130 and 132 may also be chargeable to a preset level or amount based upon parameters and characteristics associated with the aerosol 106 and the direct-write particles 108 suspended therein, such as type of particles, type of aerosol, flow rate, flow volume, concentration and similar parameters. Accordingly, the system 100 provides a non-contact system and method for manipulating the direct-write particles 108 in the aerosol 106 or ink to orient the particles in a predetermined way on the substrate 110 to form the electrical component 102 with predetermined electrical characteristics and/or structure. The external electric field 128 acts on the particles 108 in the aerosol 106 before the aerosol 106 and particles 108 are deposited on the substrate 110 and before the aerosol 106 or ink dries or is cured.

One primary distinction between the system 100 and ink jet printing technology is that ink jet printing technology uses high voltage to alter the path of a complete droplet of ink either to an intended location on a substrate or piece of paper or a waste gate. In contrast, the system 100 orients or aligns the individual particles 108 suspended in the aerosol 106 so that the direct-write particles are deposited in a predetermined orientation to control the electrical characteristics and/or structure of the component 102.

A power source 134 and associate circuitry may be provided to charge the positive and negative electrically chargeable plates 130 and 132. While the present disclosure has been described with respect the structure 126 causing alignment of the polarized direct-write particles 108, any structure that may result in the same function may be utilized.

The system 100 may also include a controller 136. The controller 136 may be adapted to control characteristics of the electric field in the holding chamber 111 and characteristics of the second or external electric field 128 for aligning the direct-write particles 108. The controller 136 may also control a flow of the deposition column 124 exiting the exit nozzle 122, a concentration of the direct-write particles 108 in the aerosol 106 as well as other aspects of the direct-write process. The controller 136 may be a microprocessor or similar device capable of controlling the different components of the system 100 to form or print different electrical components with predetermined electrical characteristics and structural characteristics as described herein.

FIG. 2 is a flow chart of a method 200 for in-process orientation of particles in a direct-write ink to control electrical characteristics of an electrical component being formed by the direct-write process or system in accordance with an embodiment of the present disclosure. The method 200 may be embodied in and/or performed by the system 100 of FIG. 1. In block 202, an ink or an aerosol containing direct-write particles may be produced or formed. Similar to that previously described, the direct-write particles may include nanomaterials or nanoparticles such as carbon nanotubes or similar particles or materials.

In block 204, the aerosol may be directed or caused to flow into a holding chamber, similar to holding chamber 111 in FIG. 1 or other containment arrangement. The direct-write particles may be suspended and/or distributed in the aerosol in the holding chamber.

In block 206, a first electric field or electromagnetic field may be generated in the holding chamber to cause electrostatic induction of the aerosol to polarize the suspended and/or distributed direct-write particles. The electric field may have predetermined characteristics, such as field strength, orientation, polarization or other characteristics as may be needed by the type of direct-write particles, concentration in the aerosol or other parameters associated with the system or process.

In block 208, the aerosol or ink containing the direct-write particles may be directed through an exit nozzle. The exit nozzle may focus the aerosol and direct-write particles or materials in a deposition column on a direct-write surface in a predetermined pattern to form a desired electrical component with predetermined characteristics and structure.

In block 210, the deposition column may pass through or be directed between a second electric field or electromagnetic field external to the direct-write device or machine. The electric field may be generated adjacent to and substantially orthogonal to the deposition column. As previously discussed, the electric field causes the polarized direct-write particles in the aerosol to be aligned in a predetermined fashion by the second or external electric field. The external electric field may have selected characteristics based on the type of direct-write particles, characteristics of the aerosol and other parameters to provide the desired orientation of the direct-write particles to form the electrical component with the predetermined or desired electrical and/or structural characteristics.

In block 212, the electrical component with the desired electrical and/or structural characteristics may be formed on the direct-write surface or substrate. As previously discussed the electrical component may include a conductive trace, resistive element or other electrical component or part of a component.

Similar to that previously described, certain aspects of the process may be controlled to provide the electrical component with the desired or predetermined characteristics. For example, characteristics or parameters associated with the electric field in the holding chamber and the external electric field may be controlled depending upon the type of direct-write material or particles being used, component being fabricated, or other aspects of the process. Examples of other parameters that may be controlled may include the flow of the deposition column, concentration or volume of the direct-write particles or material, etc.

The flowcharts and block diagrams in the Figures illustrate the architecture, functionality, and operation of possible implementations of systems and methods according to various embodiments of the present disclosure. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure.

The following claims are in no way intended to limit the scope of the disclosure to the specific embodiments described herein.

What is claimed is:

1. A method for in-process orientation of particles used in direct-write inks for fabricating an electrical component, the method comprising:
    directing an aerosol containing direct-write particles into a holding chamber;
    polarizing the direct-write particles in the aerosol by one of moving the holding chamber relative to a positive electrically charged element and a negative electrically charged element or moving the charged elements relative to the holding chamber, wherein a first electric field is produced for polarizing the direct-write particles in the holding chamber;
    directing the aerosol including the polarized direct-write particles in a deposition column on a substrate to form an electrical component;
    aligning the polarized direct-write particles in the deposition column in a selected orientation to form the electrical component with predetermined electrical characteristics.

2. The method of claim 1, further comprising aligning the polarized direct-write particles without contacting the polarized direct-write particles.

3. The method of claim 1, wherein aligning the polarized direct-write particles in the selected orientation comprises directing the deposition column between a positive electrically charged plate and a negative electrically charged plate to generate a second electric field substantially orthogonal to the deposition column to cause the polarized direct-write particles to align themselves in the selected orientation.

4. The method of claim 3, further comprising selecting a distance between the positive electrically charged plate and the negative electrically charged plate based on at least one of a parameter and a characteristic associated with at least one of the aerosol and the direct-write particles.

5. The method of claim 4, wherein the at least one of a parameter and a characteristic associated with at least one of the aerosol and the direct-write particles comprises a type of direct-write particle, a type of aerosol, a flow rate of the aerosol, a flow volume and a concentration of direct-write particles in the aerosol.

6. The method of claim 1, wherein the holding chamber is a cylindrical container formed from a conductive material and the positive electrically charged element and the negatively charged element are each an electrically conductive brush adapted to slidably contact the cylindrical container to induce the electrostatic charge in the cylindrical container.

7. The method of claim 1, further comprising:
    depositing multiple layers of direct-write particles; and
    controlling an orientation and alignment of the direct-write particles in each layer.

8. The method of claim 7, wherein the direct-write particles comprise carbon nanotubes.

9. The method of claim 8, wherein the carbon nanotubes are deposited in a predetermined pattern of layers with a selected orientation or alignment that provides a specific resistor value.

10. The method of claim 1, further comprising suspending and distributing the direct-write particles in the holding chamber.

11. A method to make an electrical component, comprising: providing a substrate;
    producing an aerosol comprising a plurality of direct-write particles;
    placing the aerosol comprising the plurality of direct-write particles in a first electric field by placing the aerosol comprising the plurality of direct-write particles in a holding chamber disposed between a positive electrically chargeable element and a negative electrically chargeable element, wherein one of the holding chamber and the electrically chargeable elements are moved relative to one another to polarize the direct-write particles in the aerosol;
    directing the aerosol comprising the polarized direct-write particles in a deposition column on a substrate to form an electrical component; and
    directing the deposition column through a second electric field to align the polarized direct-write particles in a selected orientation to form the electrical component with a predetermined electrical characteristic.

12. The method of claim 11, wherein the second electrical field is substantially orthogonal to the deposition column.

13. The method of claim 11, wherein the holding chamber is a cylindrical container formed from a conductive material and the positive electrically charged element and the negatively charged element are each an electrically conductive brush adapted to slidably contact the cylindrical container to induce the electrostatic charge in the cylindrical container.

14. The method of claim 11, further comprising:
    depositing multiple layers of direct-write particles; and
    controlling an orientation and alignment of the direct-write particles in each layer.

* * * * *